United States Patent
Nakata

(10) Patent No.: US 7,284,154 B2
(45) Date of Patent: Oct. 16, 2007

(54) SYSTEM AND METHOD FOR EVALUATING USABILITY USING VIRTUAL USER

(75) Inventor: Toru Nakata, Tokyo (JP)

(73) Assignee: National Institue of Advanced Industrial Science and Technology, Tokyo (JP)

(*) Notice: Subject to any disclaimer, the term of this patent is extended or adjusted under 35 U.S.C. 154(b) by 604 days.

(21) Appl. No.: 10/916,593

(22) Filed: Aug. 12, 2004

(65) Prior Publication Data

US 2005/0044450 A1    Feb. 24, 2005

(30) Foreign Application Priority Data

Aug. 20, 2003    (JP) .................. 2003-296257

(51) Int. Cl.
*G06F 11/00* (2006.01)
(52) U.S. Cl. ............................ 714/33; 703/6
(58) Field of Classification Search ............ 714/33, 714/32, 26, 28; 703/6
See application file for complete search history.

(56) References Cited

U.S. PATENT DOCUMENTS

| | | | |
|---|---|---|---|
| 6,370,494 B1* | 4/2002 | Mizuno et al. | 703/17 |
| 2004/0163018 A1* | 8/2004 | Yoshida | 714/48 |
| 2005/0154693 A1* | 7/2005 | Ebert | 707/1 |
| 2005/0210397 A1* | 9/2005 | Kanai et al. | 715/762 |
| 2006/0199167 A1* | 9/2006 | Yang et al. | 434/365 |

FOREIGN PATENT DOCUMENTS

JP    9-258817    10/1997

OTHER PUBLICATIONS

JIS Z 8524:1999 "Ergonomics-Office Work with Visual Display Terminals (VDTs)", 2 pages.
R.S. Bridger, Introduction to Ergonomics, McGraw-Hill, INC. 1995., pp. 380-382.
S. Sakajo, et al., "Human Error Evaluation Methods for Fieldworks", pp. 65-70, Sep. 2002.

* cited by examiner

*Primary Examiner*—Dieu-Minh Le
(74) *Attorney, Agent, or Firm*—Oblon, Spivak, McClelland, Maier & Neustadt, P.C.

(57) ABSTRACT

A usability evaluation processing system and method evaluate usability by simulation for estimating operating interaction between a user and a human interface. The usability evaluation processing system and method receive a simulation start command; input data into virtual-operation-object state data storing means, virtual-operator state data storing means, and operation procedure data storing means; perform a simulation to update virtual-operation-object state data and virtual-operator state data to states at the next time step by simulation processing means in response to a virtual-operator control signal; calculate a value of a usability evaluation function in accordance with at least one of the virtual-operation-object state data and the virtual-operator state data updated by the simulation processing means, or a history of the updated data; and output the resultant value and resultant data of the simulation.

2 Claims, 11 Drawing Sheets

FIG. 4

```
DATA TIME: 0
PHYSICAL FEATURE
NUMBER OF END-POINTS: 3
NAME OF END-POINT: S, E, H
XY COORDINATES OF S: 5, 15
XY COORDINATES OF E: 11, 7
XY COORDINATES OF H: 17, 15
NUMBER OF LINKS: 2
NAME OF LINK: U, F
END-POINTS OF LINK U: S, E
LENGTH OF LINK U: 10
END-POINTS OF LINK F: E, H
LENGTH OF LINK F: 10
NUMBER OF ANGLE PARAMETERS: 2
NAME OF ANGLE PARAMETER: Au, Af
CONTENT OF Au: X-AXIS AND Lu
CONTENT OF Af: Lu AND Lf
END OF PHYSICAL FEATURE
PHYCHOLOGICAL FEATURE
DEGREE OF SENSE OF URGENCY: 2
END OF PSYCHOLOGICAL FEATURE
END OF DATA
```

FIG. 5

```
DATA TIME: 0
NUMBER OF BUTTONS: 4
NAME OF BUTTON: B1, B2, B3, B4
XY COORDINATES OF B1: 30, 20
STATE OF B1: OFF
XY COORDINATES OF B2: 30, 10
STATE OF B2: OFF
XY COORDINATES OF B3: 25, 5
STATE OF B3: OFF
XY COORDINATES OF B4: 15, 0
STATE OF B4: OFF
END OF DATA
```

FIG. 6

```
DATA TIME: 0
NUMBER OF OPERATION STEPS: 4
PROCEDURE 1: DEPRESS B1
PROCEDURE 2: DEPRESS B2
PROCEDURE 3: DEPRESS B3
PROCEDURE 4: DEPRESS B4
PROGRESS: 0
END OF DATA
```

FIG. 11

```
CONTROL TIME: 0
TORQUE AT S: 3
TORQUE AT E: -1
END OF CONTROL
```

SYSTEM AND METHOD FOR EVALUATING USABILITY USING VIRTUAL USER

BACKGROUND OF THE INVENTION

1. Field of the Invention

The present invention relates to a system for evaluating ease-of-use (usability) of a human interface device, such as a control panel of a machine and a plant and an input and output device of a computer, by computer simulation. In particular, the present invention relates to a system for evaluating usability which is suitably used to design an easy-to-use human interface device, and a system and a method for evaluating usability of a human interface device by simulation.

2. Description of the Related Art

To design a human interface of a system that interacts with an operator using various types of inputs and outputs and to evaluate usability of the interface, one of the following known methods has been employed, depending on the function and usability: (1) A method for designing improved operation of individual elements; (2) A method for designing improved operation adaptable to operator's intuition; (3) A method for designing improved operation by differentiating similar elements; (4) A method for designing improved operation by aggregation of operation tasks; (5) A usability evaluation method using operators; (6) A usability evaluation method using a digital mannequin; (7) An operator-workload evaluation method using operation schedule simulation.

(1) Method for Designing Improved Operation of Individual Elements

This method, in a design phase, is characterized in that each human interface element, such as a control panel element including a button and a lever, and a visual screen element on a screen is designed to avoid human perceptional and operational errors. In an evaluation phase, the amount and qualities of features of the elements are evaluated for every element and are added. The total value is used for the usability evaluation of the entire system. For example, a button considered to be frequently used during normal operation is enlarged and painted with a striking color, as is disclosed in "Ergonomics—Office work with visual display terminals (VDTs)—Menu dialogues", JIS Z 8524:1999, Identical translation of ISO 9241-14, 8.1.6a, 1997.

(2) Method for Designing Improved Operation Adaptable to Operator's Intuition

According to this method, in the design phase, features of human interface elements are designed so as to adapt to human psychological characteristics. In the evaluation phase, the adaptation rates of the feature of each human interface element are measured and added for the entire system to evaluate the usability. For example, a moving machine is moved forward by forcing a lever forward. Since the moving direction of the machine is identical to the tilting direction of the lever, the operator intuitively and easily memorizes the operation, as is disclosed in "Introduction to Ergonomics", by R. S. Bridger, McGraw-Hill, Inc., 1995.

(3) Method for Designing Improved Operation by Differentiating Similar Elements

According to this method, features of human interface elements having similar display positions, display sequences, and perceptual properties are designed to decrease the similarity, and therefore, the recognition error between similar elements is reduced. In the evaluation phase, the usability is evaluated by a small similarity between the interface elements. For example, by disposing small protrusions on the "F" and "J" keys on a keyboard, these keys are distinguishable from the adjacent keys, and therefore, the recognition error is suppressed during touch typing.

(4) Method for Designing Improved Operation by Aggregation of Operation Tasks

According to this method, a typical operational activity sequence of an operator is defined, and one unit of operational activity is evaluated in consideration with the previous operational activity. In a design phase, the previous operational activity is determined to suppress recognition errors and operational errors in the unit of activity. For example, when an operator of a control panel of a plant performs an operation in a typical turn (step), buttons to be depressed for the steps are arranged in a line from left to right in the depressing order. Thus, the recognition error of the buttons and sequence error of depressing the buttons are suppressed, as is disclosed in "Human Error Evaluation Methods for Fieldworks", by Satoko Sakajo, Takashi Nakagawa, and Naotaka Terashita, Proceedings of the Sensing Forum of The Society of Instrument and Control Engineers, pp. 65-69, 2002 (in Japanese).

(5) Usability Evaluation Method Using Operators

According to this method, operators actually operate an object to be evaluated, and the operation activity is then analyzed. In addition, subjective opinions of the experimental subjects are taken to evaluate the usability of the object.

(6) Usability Evaluation Method Using a Digital Mannequin

According to this method, by using an operation object model and a digital mannequin, which are created by modeling the shape of an operation object and the human body mechanism of an operator, respectively, operation activities are simulated, and then the usability of the operation object is evaluated.

(7) Operator-Workload Evaluation Method Using Operation Schedule Simulation.

According to this method, a scenario of an operation schedule for control of a specific plant is prepared, and a simulation that estimates the workload which an operator feels is executed by a computer to estimate an operating state and the operator's workload in that state. By this simulation, the usability of the operation object is evaluated. For example, a "man-machine interface design evaluating device" is disclosed in Japanese Unexamined Patent Application Publication No. 9-258817.

This man-machine interface design evaluating device evaluates man-machine interface design, such as a control panel of a plant and a CRT screen, in terms of functionality and usability. To evaluate the man-machine interface design for monitoring a plant operation, this device includes an input and display unit that communicates with an operator, a design data editing unit that creates or edits man-machine interface design data based on the information via the input and display unit, a design database that stores the design data created by the design data editing unit, a plant simulation unit that simulates any operating state of the plant, a man-machine interface simulation unit that simulates displayed information of the man-machine interface based on plant data from the plant simulation unit and the design data from design database and that displays an operating state of the man-machine interface on the input and display unit, a human activity simulation unit that simulates a human activity which sends and receive data to and from the simulated man-machine interface, and a human activity evaluation unit that evaluates human activity data simulated by the human activity simulation unit.

However, the methods described in (1) and (2) above are used to qualitatively evaluate an individual human interface element so as to improve and design it, and therefore, these methods do not provide satisfactory guidelines to increase ease-of-usability through the entire human interface structure.

The method described in (3) above is used to qualitatively suppress the confusion of an individual human interface element with a similar one, and therefore, this method does not provide satisfactory guidelines to improve ease-of-usability through the entire human interface structure. Moreover, in actual usage environments, estimating the effect on suppression of the confusion is difficult.

The method described in (4) above is used to design and evaluate usability only for an operation sequence of a specifically assumed task, not for an operation sequence in actual usage environments. In particular, even in a typical operation activity sequence, interruption or sequence change sometimes occurs during execution. Therefore, the assumption used in the evaluation of the operation activity is not always true, which is a problem.

In the method described in (5) above, to obtain a sufficiently effective usability evaluation result, experiments using a large number of operators are required. This increases the cost due to the time and materials required, thus limiting the number of types of objects to be evaluated and the number of experimental items. Also, even the property of a single operator varies with the experience and fatigue of the operator. Consequently, a comparison between a long-term experimental result and a short-term experimental result is difficult, which is a problem.

In the method described in (6) above, since a kinetic interaction between an evaluation object and a digital mannequin is simulated, the evaluation is only focused on kinetic usability items, such as workload caused by a gravitational force and energy consumption. Consequently, the usability in terms of perception, recognition, and judgment of the operation is not directly evaluated, which is a problem.

In particular, a trial has not been done in which perception information to be perceived by the digital mannequin is simulated sufficiently accurately in accordance with simulation environment, and in which the digital mannequin carries out an action based on the perception information. Therefore, although human passive activities can be simulated, the simulation of human active activities is difficult.

Furthermore, in this method, since no perception information to be perceived by the digital mannequin is simulated sufficiently accurately, an incorrect simulation cannot be prevented. The incorrect simulation includes the case where information of part of the object that is hidden and cannot be seen based on the posture of the digital mannequin and position of the object is presented to the designer of the operation, and the designer designs and specifies the action of the digital mannequin based on the information.

In the method described in (7) above, although perception and activities of an operator are attempted to be simulated, specific technology to achieve the goal is not disclosed. That is, the method discloses no details of the data and information processing algorithm to simulate the perception and activities. The method only implies the target items to be analyzed. Furthermore, according to this method, the ease of usability of the operation object is evaluated by determining whether or not a workload calculated by the simulation exceeds a threshold value. However, the method does not determine which factor among the ones influencing the operating state is responsible for the increased workload and does not determine to what extent that factor is responsible for the increased workload. Therefore, although the usability of the entire operation object can be determined, it is difficult to determine which part of the operation object must be modified.

In this method, if an operational error occurs in the simulation, the occurrence is only reported. However, an actual human behavior is capable of learning effective operations and reminders of the operations based on an operation history including operational errors. Accordingly, to execute a more realistic simulation, the method should include modification means for modifying the control of the operator actions depending on the operational errors by using feedback. However, this method does not provide specific modification means, which is a problem.

As described above, all the known methods do not disclose specific technologies that allow for automatic design of the human interface. Therefore, although systems having a variety of operations require a large number of human interface elements, the layout design of the control panel of the system is carried out by hand, thus disadvantageously imposing an enormous burden on the designers.

SUMMARY OF THE INVENTION

Accordingly, it is an object of the present invention to provide a usability evaluation processing system and method for evaluating usability by effectively performing a simulation that estimates an interaction between a user operation including an active action of the user and a human interface.

In other words, it is an object of the present invention to provide a usability evaluation processing system for evaluating, by a computer, usability of a human interface device, such as an control panel of a machine and a plant and an input and output device. In addition, it is another object of the present invention to provide a usability evaluation processing system and method suitable for use for designing an easy-to-use human interface and capable of evaluating the usability, through simulation by a computer, for designing the human interface.

According to the present invention, a usability evaluation processing system for evaluating usability by simulation for estimating operating states associated with a human body action with respect to an operation object includes virtual-operation-object state data storing means for storing virtual-operation-object state data representing a physical state of the operation object; virtual-operator state data storing means for storing virtual-operator state data representing physical and psychological states of a human; operation procedure data storing means for storing operation procedure data representing an operation procedure sequence; virtual-operator control signal generating means for generating a virtual-operator control signal controlling the virtual-operator state data based on the operation procedure data, the virtual-operation-object state data, and the virtual-operator state data; simulation processing means for updating the virtual-operation-object state data and the virtual-operator state data to states at the next time step based on the virtual-operation-object state data, the virtual-operator state data, and the virtual-operator control signal; input means for receiving a simulation start command, for inputting data to the virtual-operation-object state data storing means, the virtual-operator state data storing means, and the operation procedure data storing means, and for inputting a simulation start signal to the simulation processing means; usability evaluating means for calculating a value of a usability evaluation function in accordance with at least one of the virtual-operation-object state data and the virtual-operator state data updated by the simulation processing means, or a history of the updated data; and output means for outputting resultant data of the simulation and the usability evaluation value.

Herein, the virtual operation object state data is numerical data or nominal scale data that represents a physical state of an object to be operated. The virtual operator state data is numerical data or nominal scale data that represents a physical state and a psychological state of the entire or partial human body.

In general, a human operational action is planned and executed in accordance with physical states of an operation object and the human body, a psychological state of a human, and an operation task of the human. The physical states include dimensions, visual characteristics, and behavior characteristics of the operation object, and the kinetic characteristics, shape, and posture of a human body. The psychological state of a human includes a point of attention, arousal of consciousness, sense of urgency, preference, behavior tendency, and a memory. Herein, a physical value that changes in synchronization with a movement of a human body part, such as a position of a mouse pointer on a screen and a position of a stylus pen tip, is considered to be one of the physical states.

According to the present invention, information on a physical state of an operation object for the simulation can be independently managed as virtual-operation-object state data. Information on physical and psychological states of an operator can be independently managed as virtual-operator state data, and information on an operation task can be independently managed as operation procedure data.

According to the present invention, a virtual-operator control signal generating means receives the virtual-operation-object state data, the virtual-operator state data, and the operation procedure data, and then generates a control signal to control the virtual-operator state data based on the received data. That is, the virtual-operator control signal generating means functions as the brain of an operator in the simulation world. The virtual-operator control signal generating means simulates operation commands using information of the operation object, the operator, and the operation procedure. Accordingly, the virtual-operator control signal generating means directs a simulation processing means to simulate a result of the direction in accordance with the operating state, as if the virtual-operator control signal generating means is a human.

Thus, according to the present invention, the physical state of the operation object, physical and psychological states of the operator, and the procedure of the operator's task, all of which are objects to be simulated, are converted to data. The data are independently stored. An action plan of the operator is created based on the data, and is updated in accordance with the progress of the simulation. Therefore, the plan and the execution of the operator can be effectively simulated depending on the operating state.

In particular, operation object data, such as the dimensions and kinetic characteristics, is generally created as modeling data by a CAD system during a design phase. According to the present invention, this information is stored in the virtual-operation-object state data storing means as virtual-operation-object state data and managed independently from other information. Accordingly, when simulations for various operation objects are required, the simulation can be performed by simply replacing the virtual-operation-object state data with CAD data for the simulation. As a result, the simulation can be effectively performed.

Furthermore, human body data, such as the dimensions and kinetic characteristics, has already been accumulated as anatomical knowledge. According to the present invention, this information is stored in the virtual-operator state data storing means as virtual-operator state data and managed independently from other information. Accordingly, when simulations for various types of operators are required, the simulation can be performed by simply changing the virtual-operator state data for the simulation. As a result, the simulation can be effectively performed.

Moreover, in general, since a human operator seldom makes mistakes in an operation plan, a large number of trials are required until an operational error that indicates a defect of a human interface occurs in an ergonomic experiment. According to the present invention, the number of errors in an operation plan carried out by a virtual operator can be artificially increased by changing the parameters of the algorithm in the virtual-operator control signal generating means. Accordingly, even in a relatively small number of trials, an operational error state due to the operator's error in decision making can be estimated.

BRIEF DESCRIPTION OF THE DRAWINGS

FIG. 4 is a diagram for explaining virtual-operator state data shown in FIG. 1;

FIG. 5 is a diagram for explaining virtual-operation-object state data shown in FIG. 1;

FIG. 6 is a diagram for explaining operation procedure data shown in FIG. 1;

FIG. 11 is an example of virtual-operator control signal data generated in the virtual-operator control signal generating process;

DESCRIPTION OF THE PREFERRED EMBODIMENTS

Figure 1:
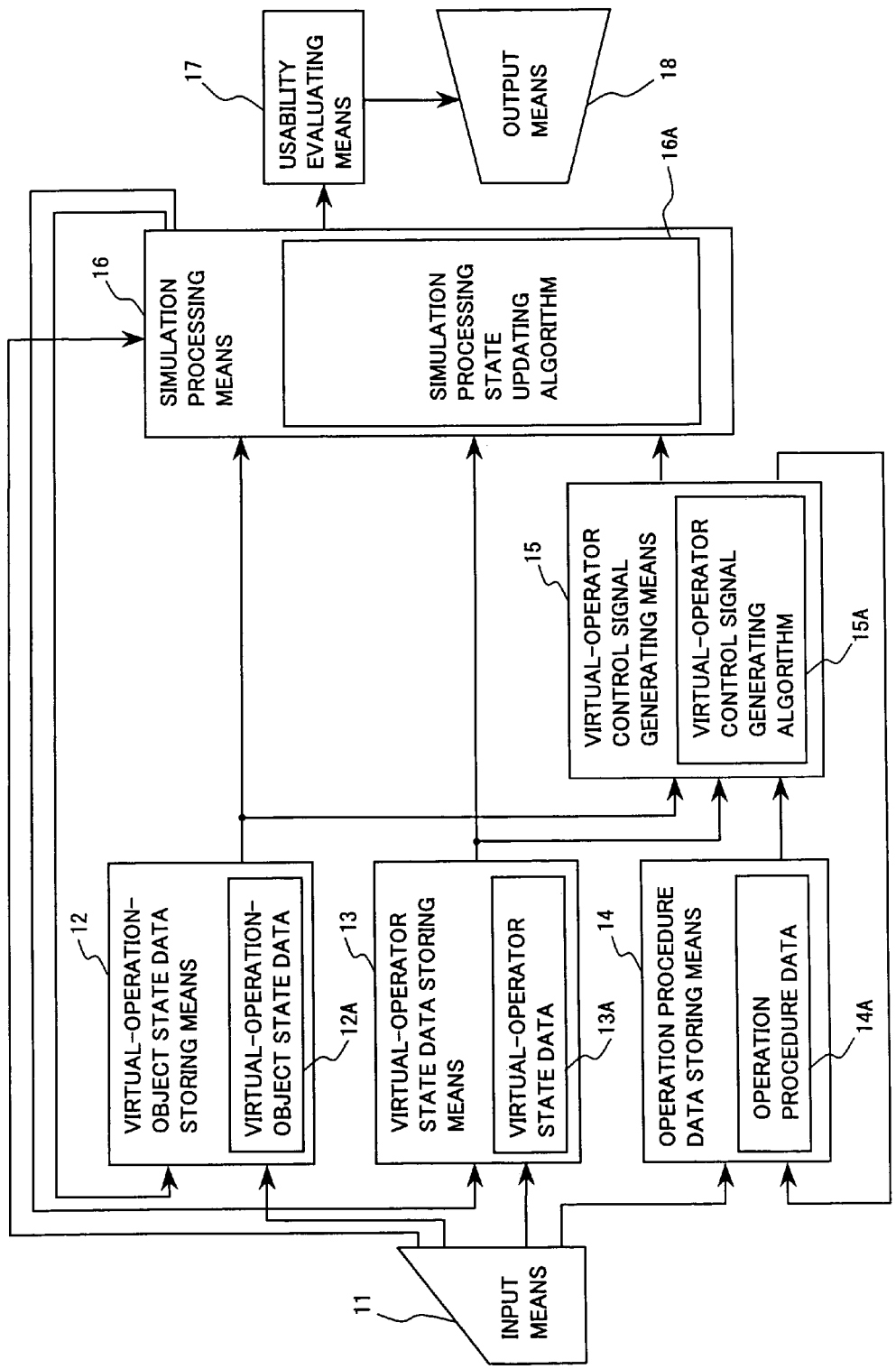
FIG. 1 is a block diagram of a usability evaluation processing system according to an embodiment of the present invention.

Embodiments of the present invention will be described below with reference to the accompanying drawings. FIG. 1 is a block diagram of a usability evaluation processing system according to an embodiment of the present invention. As shown in FIG. 1, in order to perform a simulation to estimate an operating state using an action of a human body with respect to an operation object, the usability evaluation processing system according to the embodiment includes input means 11, virtual-operation-object state data storing means 12 that stores virtual-operation-object state data 12A, virtual-operator state data storing means 13 that stores virtual-operator state data 13A, operation procedure data storing means 14 that stores operation procedure data 14A, virtual-operator control signal generating means 15 that generates a virtual-operator control signal by execution of virtual-operator control signal generating algorithm 15A, simulation processing means 16 that performs a simulation by execution of a simulation-processing-state updating algorithm 16A, usability evaluating means 17, and output means 18.

The input means 11 may include a keyboard and a file system of a computer. The means for storing data, that is, the virtual-operation-object state data storing means 12, the virtual-operator state data storing means 13, and the operation procedure data storing means 14 may include a memory unit and a file system of a computer.

The virtual-operator control signal generating means 15, the simulation processing means 16, and the usability evaluating means 17 perform data processing, such as receiving input data, executing the virtual-operator control signal generating algorithm 15A, and allowing the resultant data to be read from outside. For example, the virtual-operator control signal generating means 15, the simulation processing means 16, and the usability evaluating means 17 include a processor (CPU) of a computer device. The output means 18 may include a display and a file system of a computer device.

Figure 2:
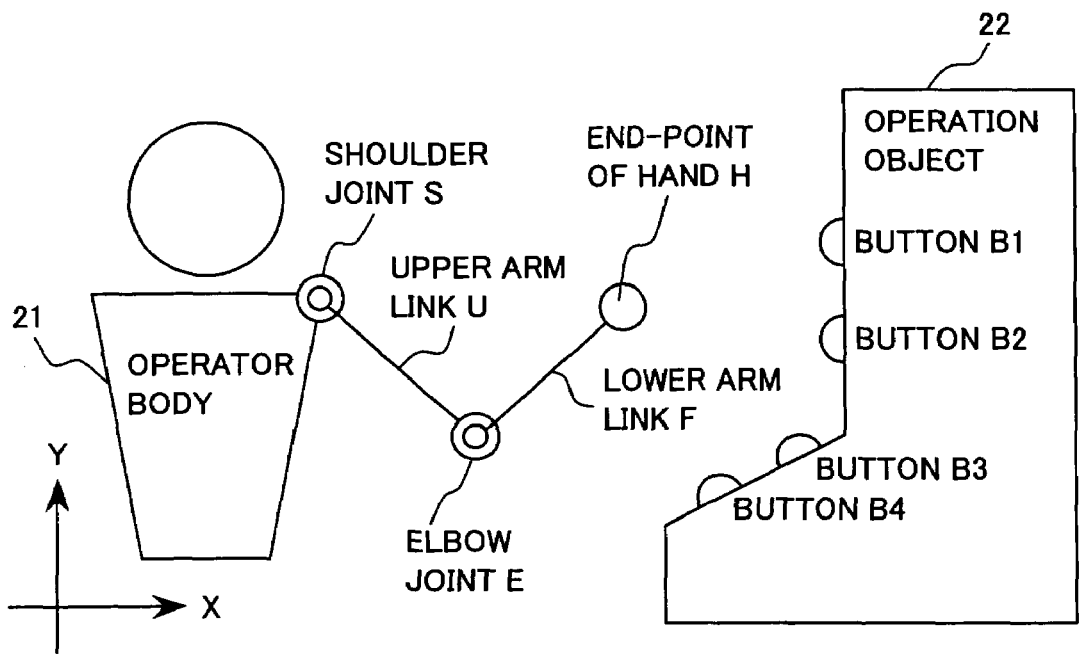
FIG. 2 illustrates a relationship between a one-hand model and an operation object in a simulation in which the human hand operates the buttons.

A simulation for evaluating the usability will be described next in detail. For the sake of better understanding, a method for modeling a virtual operator and a setting of the virtual-operator state data 13A will be described first. As shown in FIG. 2, the modeling of a virtual operator is performed for the case where a human hand operates buttons. Herein, the following case will be described: Operating states are simulated in the case of an operation of buttons on a control panel (buttons B1 to B4 of an operation object 22). Then, the usability of the control panel is evaluated based on the simulation result.

FIG. 2 illustrates the relationship between the model of a human hand and an operation object in a simulation in which the human hand operates the buttons. In the simulation, for the sake of brevity, a model of a human body 21 of an operator and the operation object 22 are created as follows. Herein, a simulation in a two-dimensional space defined only by the X coordinate in the horizontal direction and the Y coordinate in the vertical direction is performed. However, a simulation in three-dimensional space is possible. Although a description is not included here, the simulation in three-dimensional space can be performed in the same manner.

The human body 21 has only two movable parts, an upper arm and a lower arm of a hand. The presence and movements of the other parts are ignored. As shown in FIG. 2, in the human body 21, the position of a shoulder joint S, which is a base point of the upper arm, remains unchanged, thus functioning as a simple bearing. A model of the upper arm is an upper arm link U, and a model of the lower arm is a lower arm link F. The upper arm link U is joined with the lower arm link F by a rotary elbow joint E. An end-point of the lower arm link F is an end-point of the hand H. The operation buttons B1 to B4 are disposed on the control panel of the operation object 22.

Figure 3:
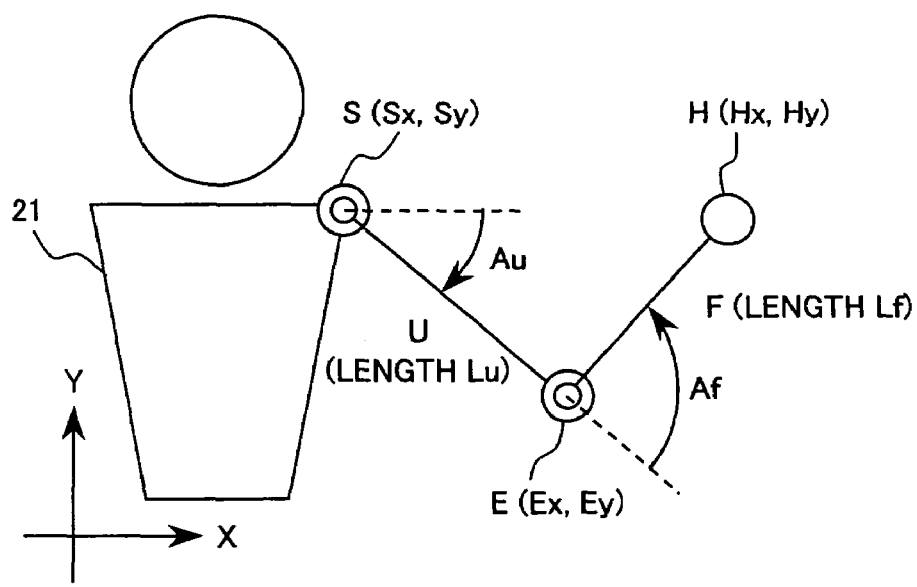
FIG. 3 illustrates a diagram for explaining how feature parameters defining a physical state, namely, the posture and movement of the one-hand model shown in FIG. 2, are determined.

FIG. 3 illustrates a diagram for explaining how feature parameters defining a physical state, namely, the posture and movement of the one-hand model shown in FIG. 2, are determined. As shown in FIG. 3, feature parameters are determined to define a physical state, namely, the posture and movement of the one-hand model. That is, the XY coordinates of the shoulder joint S are defined as (Sx, Sy), the XY coordinates of the elbow joint E are defined as (Ex, Ey), and the XY coordinates of the end-point of hand H are defined as (Hx, Hy). The angle defined by the X-axis and the upper arm link U is Au, and the angle defined by the upper arm link U and the lower arm link F is Af. The length of the upper arm link U is Lu, and the length of the lower arm link F is Lf. These are the data representing physical features of the operator for the simulation.

The data for psychological features of the operator includes intensity of a sense of urgency of the operator as a parameter that dominates the operator's behavior. The intensity is represented by a degree of sense of urgency K, which is a scalar value. Basically, the virtual-operator state data includes the dimensions and mechanism of the one-hand model, and the degree of sense of urgency K. In general, this data includes data referred to as "nominal scale data", whose scales are appropriately defined, and is used using the scale.

FIG. 4 is a diagram for explaining the virtual-operator state data 13A shown in FIG. 1. FIG. 5 is a diagram for explaining the virtual-operation-object state data 12A shown in FIG. 1. FIG. 6 is a diagram for explaining the operation procedure data 14A shown in FIG. 1. As shown in FIG. 4, the virtual-operator state data 13A is represented as text data and is stored in the virtual-operator state data storing means 13. Similarly, the virtual-operation-object state data 12A and the operation procedure data 14A are represented as text data and are stored in the corresponding storing means.

A method for modeling the virtual operation object and the setting of the virtual-operation-object state data 12A will be described next. As previously described with reference to FIG. 2, four buttons B1 to B4 are disposed on the control panel, which is the operation object 22, to receive inputs from an operator. In the modeling, the state of the button B1 to B4 changes to "ON" when the end-point of hand H of the operator reaches the button. Otherwise, the state of the button stays "OFF". Accordingly, sufficient button information for the simulation is obtained by simply specifying coordinates of positions of the buttons B1 to B4 and initial states (ON or OFF) of the buttons. Therefore, the virtual-operation-object state data 12A includes the number of buttons and the coordinate data of the buttons.

The names of the buttons on the control panel are defined as B1, B2, B3, and B4. The XY coordinates of the buttons B1, B2, B3, and B4 are (B1x, B1y), (B2x, B2y), (B3x, B3y), and (B4x, B4y), respectively. When the simulation starts, the states of all the buttons are "OFF". As shown in FIG. 5, these data are represented as text data and are stored in the virtual-operation-object state data storing means 12.

A method for modeling the operation procedure data 14A and the setting of the operation procedure data 14A will be described next. Herein, the operation procedure is defined as a sequence of operation steps. Each operation procedure can be defined as depressing a button. As shown in FIG. 6, the operation procedure data 14A is represented as text data.

Figure 7:
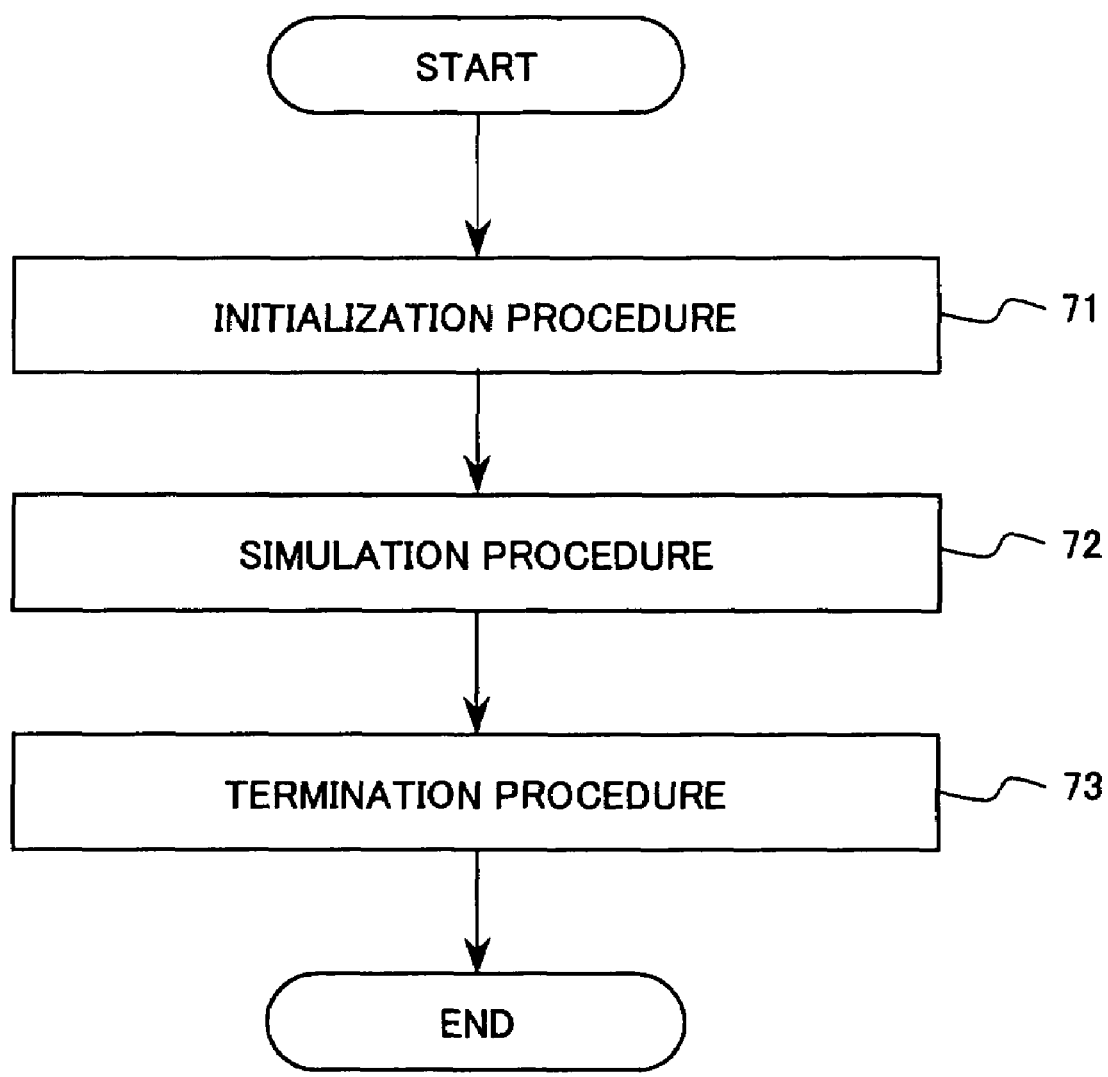
FIG. 7 is a flow chart of simulation processing.
Figure 8:
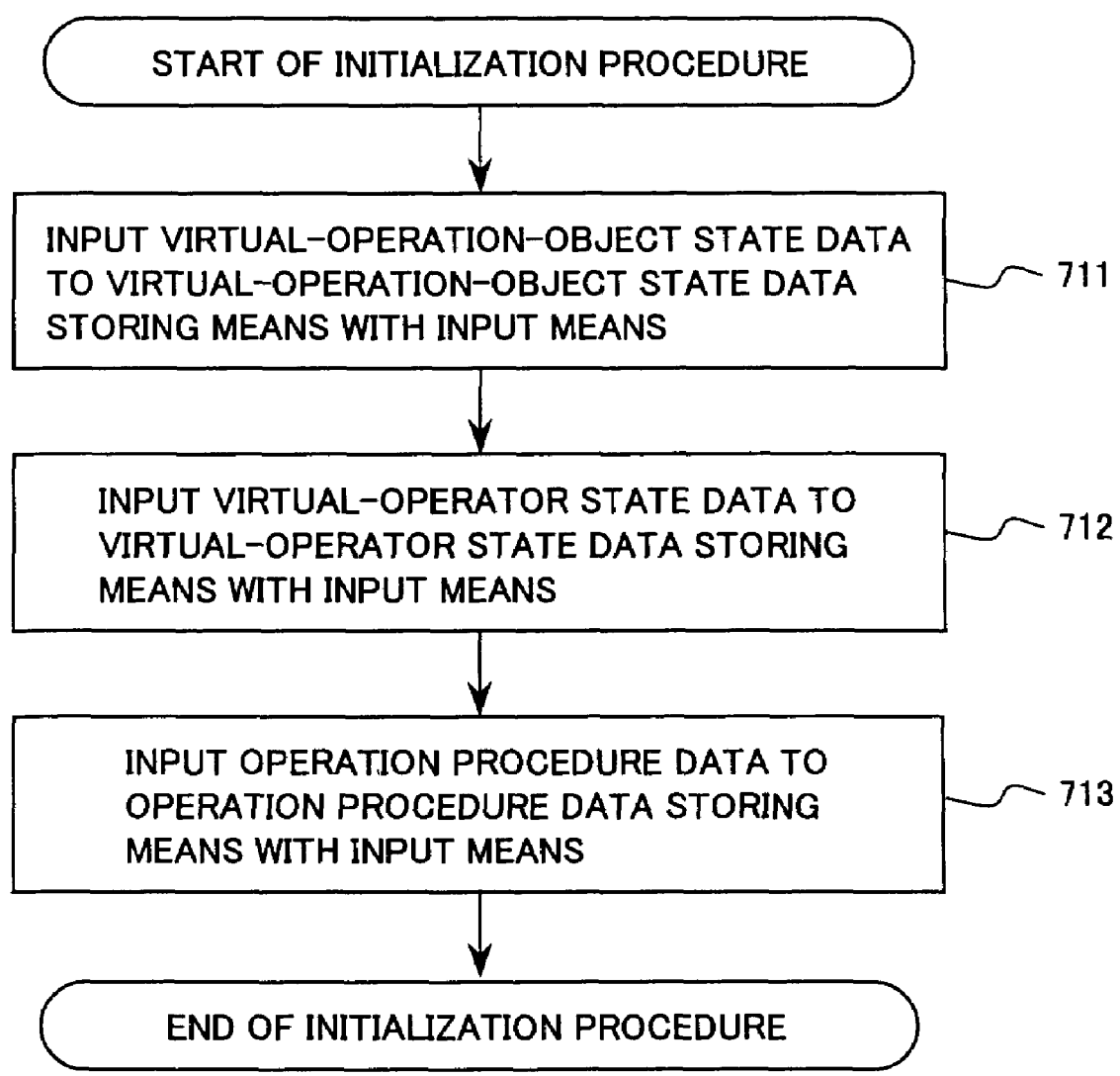
FIG. 8 is a flow chart of an initialization procedure of the simulation processing.
Figure 9:
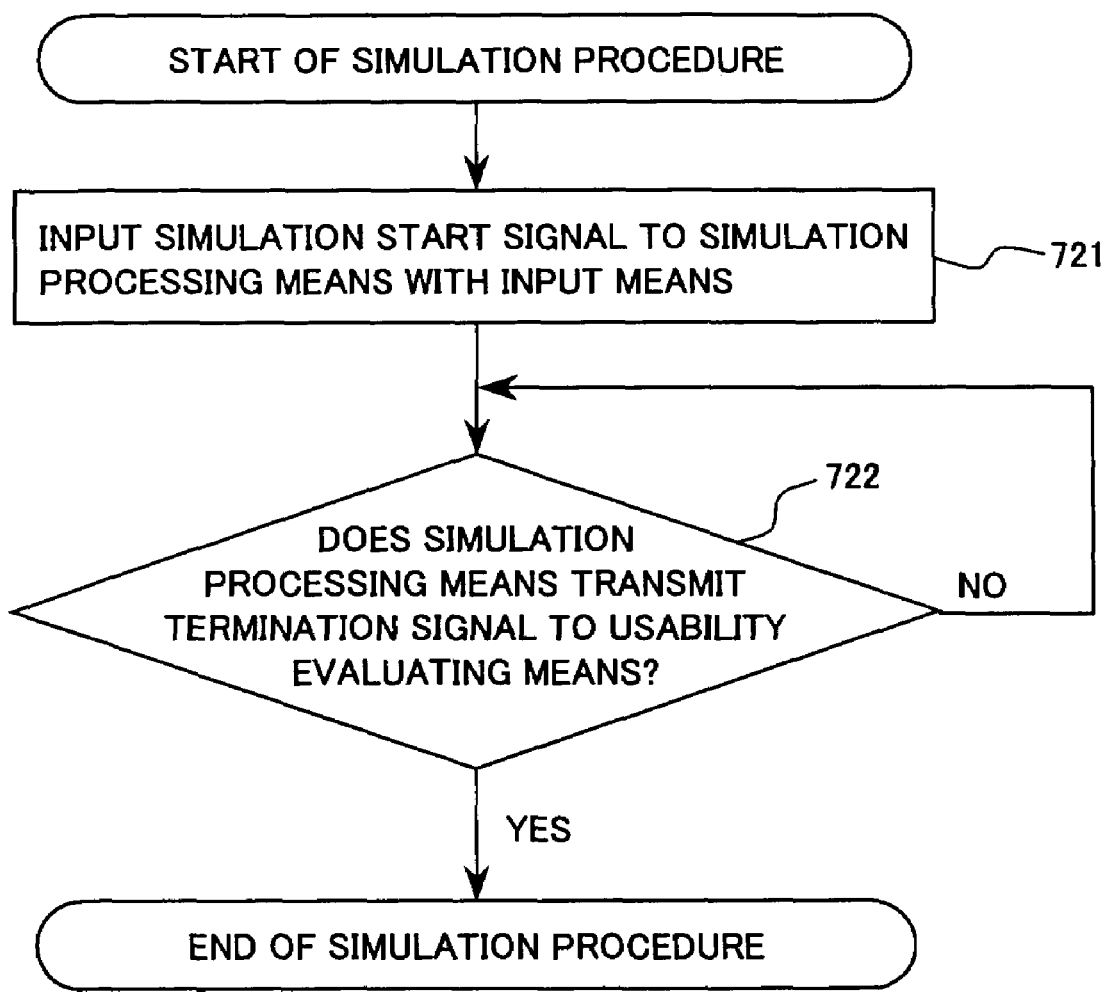
FIG. 9 is a flow chart of a simulation procedure of the simulation processing.

Simulation processing will be described next. FIG. 7 is a flow chart of the simulation processing. FIG. 8 is a flow chart of an initialization procedure of the simulation processing. FIG. 9 is a flow chart of a simulation procedure of the simulation processing. The simulation is performed by using the virtual-operation-object state data 12A while increasing the data time. As shown in FIG. 7, the simulation is performed in the following sequence of processing steps:

an initialization procedure (step 71), a simulation procedure (step 72), and a termination procedure (step 73). These steps are repeatedly carried out.

First, the initialization procedure (step 71) will be described. As shown by the flow chart in FIG. 8, in the initialization procedure, all data input from the input means are stored in the corresponding storing means. That is, the input means 11 inputs the virtual-operation-object state data 12A into the virtual-operation-object state data storing means 12 (step 711), inputs the virtual-operator state data 13A into the virtual-operator state data storing means 13 (step 712), and inputs the operation procedure data 14A into the operation procedure data storing means 14 (step 713). Thus, the virtual-operation-object state data 12A shown in FIG. 5 is stored in the virtual-operation-object state data storing means 12. The virtual-operator state data 13A shown in FIG. 4 is stored in the virtual-operator state data storing means 13. The operation procedure data 14A shown in FIG. 6 is stored in the operation procedure data storing means 14. These data are, for example, text data, and are retained in memories of the corresponding storing means.

A simulation procedure (step 72) will be described next. As shown by the flow chart in FIG. 9, in the simulation procedure, the input means 11 inputs a simulation start signal to the simulation processing means 16 (step 721), and then it is determined whether the simulation processing means 16 transmits a termination signal to the usability evaluating means 17 (step 722). That is, the simulation procedure is completed after confirming that the simulation processing means 16 transmits the termination signal to the usability evaluating means 17. The process of the simulation procedure will be described in more detail below. That is, during the simulation procedure, the simulation processing means 16 runs the simulation processing state updating algorithm 16A shown in FIG. 9. These two algorithms in this step process the signals for the simulation.

Figure 10:
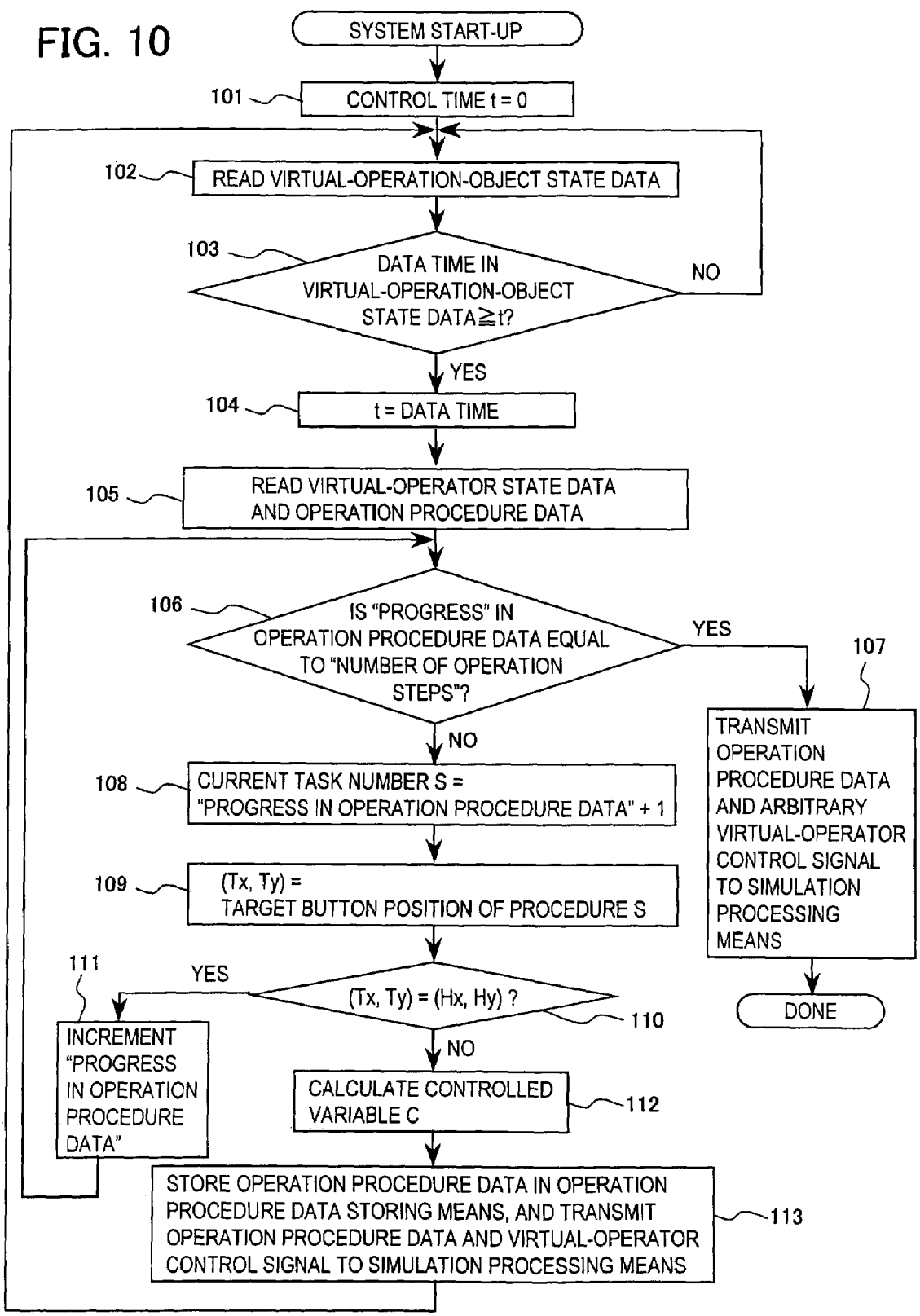
FIG. 10 is a flow chart of a virtual-operator control signal generating process.

In the signal processing for the simulation, the virtual-operator control signal generating means 15 generates a virtual-operator control signal. This operation will be described here. FIG. 10 is a flow chart of a virtual-operator control signal generating process. FIG. 11 is an example of the virtual-operator control signal data generated in the virtual-operator control signal generating process. As shown in FIG. 11, virtual-operator control signal data, which is text data, includes a time t as "control time", a controlled variable Cu used for generating the virtual-operator control signal as "torque at S", a controlled variable Cf used for generating the virtual-operator control signal as "torque at E".

In the virtual-operator control signal generating process, as shown by the flow chart in FIG. 10, the operation procedure data 14A having an updated "progress" is overwritten and stored in the operation procedure data storing means 14. Thereafter, the operation procedure data 14A and the virtual-operator control signal are transmitted to the simulation processing means 16 to advance the process. The virtual-operator control signal generating means 15 has an internal variable "control time t", which is a time counter. At first, the control time t is set to "0" (step 101). Then, the virtual-operation-object state data 12A is read and it is determined whether or not the "data time" in the virtual-operation-object state data 12A is greater than the control time t. Reading of the virtual-operation-object state data 12A is repeated until the "data time" becomes greater than the control time t (steps 102 and 103). If the answer of the determination is "Yes", the "data time" is assigned to the control time t (step 104).

That is, at early operation time, the virtual-operator control signal generating means 15 reads the virtual-operation-object state data 12A in the virtual-operation-object state data storing means 12 as many times as possible. Then, by comparing the retrieved data time, which is an element of the virtual-operation-object state data 12A, with the time t (process time), an update of the virtual-operation-object state data 12A is detected. If the update of the virtual-operation-object state data 12A is detected, the process proceeds to a virtual-operator control signal generating procedure.

In the virtual-operator control signal generating procedure, the "data time" is assigned to the control time t (step 104). Then, the virtual-operator state data 13A and the operation procedure data 14A are read from the corresponding data storing means (step 105). In order to determine if all of the operation procedures are completed, it is determined whether or not the "progress" is equal to the "number of operation steps" in the operation procedure data 14A (step 106). If the values of the "number of operation steps" and the "progress" in the operation procedure data 14A are equal, it is determined that all of the operation procedures are completed. Accordingly, the operation procedure data 14A and a virtual-operator control signal are delivered to the simulation processing means 16 (step 107). At that time, the delivered virtual-operator control signal is not used by the simulation processing means 16, and therefore, arbitrary data content is allowed. For example, in this embodiment, a virtual-operator control signal having a data content shown in FIG. 11 is delivered.

If it is determined that the "progress" is not equal to the "number of operation steps" in the operation procedure data 14A, that is, all of the operation procedures are not completed, data required for the current operation task is read from the operation procedure data 14A. More specifically, the value of "progress" is incremented. The resultant value is assigned to a variable "current task number S" (step 108), and "procedure" data having the number S is read (step 109).

The procedure is referred to as "a current task". Next, a target controlled value to achieve the current task is calculated. In this embodiment, since all the operation tasks are depressing a button, each task is achieved by moving the end-point of hand H to coordinates of the button. That is, coordinates of the target button position of the task S are assigned to a variable "target coordinates (Tx, Ty)" (step 109). A target controlled value of the virtual-operator state data 13A is (Tx, Ty) for the coordinate of the end-point of hand H (Hx, Hy).

In the virtual-operator control signal generating procedure, in order to determine whether or not a current task is achieved, the coordinate of the end-point of hand H (Hx, Hy) is compared to the target coordinates (Tx, Ty) (step 110). If the coordinates of the end-point of hand H (Hx, Hy) are equal to the target coordinates (Tx, Ty), that is, if the current task is achieved, the current task is replaced with the next operation procedure (step 111).

If the coordinates of the end-point of hand H (Hx, Hy) are not equal to the target coordinates (Tx, Ty), that is, if the current task is not achieved, a controlled variable C is calculated in a manner as will be described below (step 112). The operation procedure data 14A is written in the operation procedure data storing means 14, and the operation procedure data 14A and a virtual-operator control signal are delivered to the simulation processing means 16. Subsequently, the process proceeds to step 102 to repeat the above-described processing.

A specific virtual-operator control signal generating procedure will be described next. Differences between the values of controlled object and target controlled values are controlled residual values Rx and Ry. That is, Rx and Ry are defined by the following equations (1) and (2):

$$Rx = Tx - Hx \quad (1)$$

$$Ry = Ty - Hy \quad (2)$$

In this embodiment, since an operation of a human hand is estimated by simulation, joint angles Au and Af in a model of a virtual operator's mechanism are variables capable of being directly controlled so as to follow the human operation control.

The controlled variable of the control signal is calculated as follows (step 112):

In the model of a virtual operator's mechanism, the conditions of the mechanism determine the relationship between the variables as follows.

$$Ex = Sx + Lu \cdot \cos Au \quad (3)$$

$$Ey = Sy + Lu \cdot \sin Au \quad (4)$$

$$Hx = Ex + Lf \cdot \cos(Au + Af) \quad (5)$$

$$Hy = Ey + Lf \cdot \sin(Au + Af) \quad (6)$$

When Hx and Hy are partially differentiated with respect to Au and Af, the following equations (7) to (10) are obtained:

$$\frac{\partial H_x}{\partial A_u} = -L_u \sin A_u - L_f \sin(A_u + A_f) \quad (7)$$

$$\frac{\partial H_y}{\partial A_u} = L_u \cos A_u + L_f \cos(A_u + A_f) \quad (8)$$

$$\frac{\partial H_x}{\partial A_f} = -L_f \sin(A_u + A_f) \quad (9)$$

$$\frac{\partial H_y}{\partial A_f} = L_f \cos(A_u + A_f) \quad (10)$$

Herein, the baseline values Fu and Ff of a feedback signal are defined as follows:

$$F_u = R_x \frac{\partial H_x}{\partial A_u} + R_y \frac{\partial H_y}{\partial A_u} \quad (11)$$

$$F_f = R_x \frac{\partial H_x}{\partial A_f} + R_y \frac{\partial H_y}{\partial A_f} \quad (12)$$

In the virtual-operator control signal generation, the controlled variable Cu and Cf are given by the following equations:

$$C_u = PF_u + I \int F_u dt \quad (13)$$

$$C_f = PF_f + I \int F_f dt \quad (14)$$

where P and I are parameters of a proportional and integrating control, which are given by the following equations (15) and (16) in accordance with the degree of sense of urgency K:

$$P = 0.2K \quad (15)$$

$$I = 0.1K \quad (16)$$

That is, these equations reproduce a phenomenon wherein a feedback gain of a human body control increases under a condition where an operator psychologically feels a sense of urgency.

Thus, calculated data of the virtual-operator control signal is created as text data, which include control time t as the control time, the controlled variable Cu as the "torque at S", and the controlled variable Cf as "torque at E", as described above. The operation procedure data 14A having the updated progress status is overwritten and stored in the operation procedure data storing means 14. Subsequently, the operation procedure data 14A and the virtual-operator control signal are delivered to the simulation processing means 16 (step 113).

Figure 12:
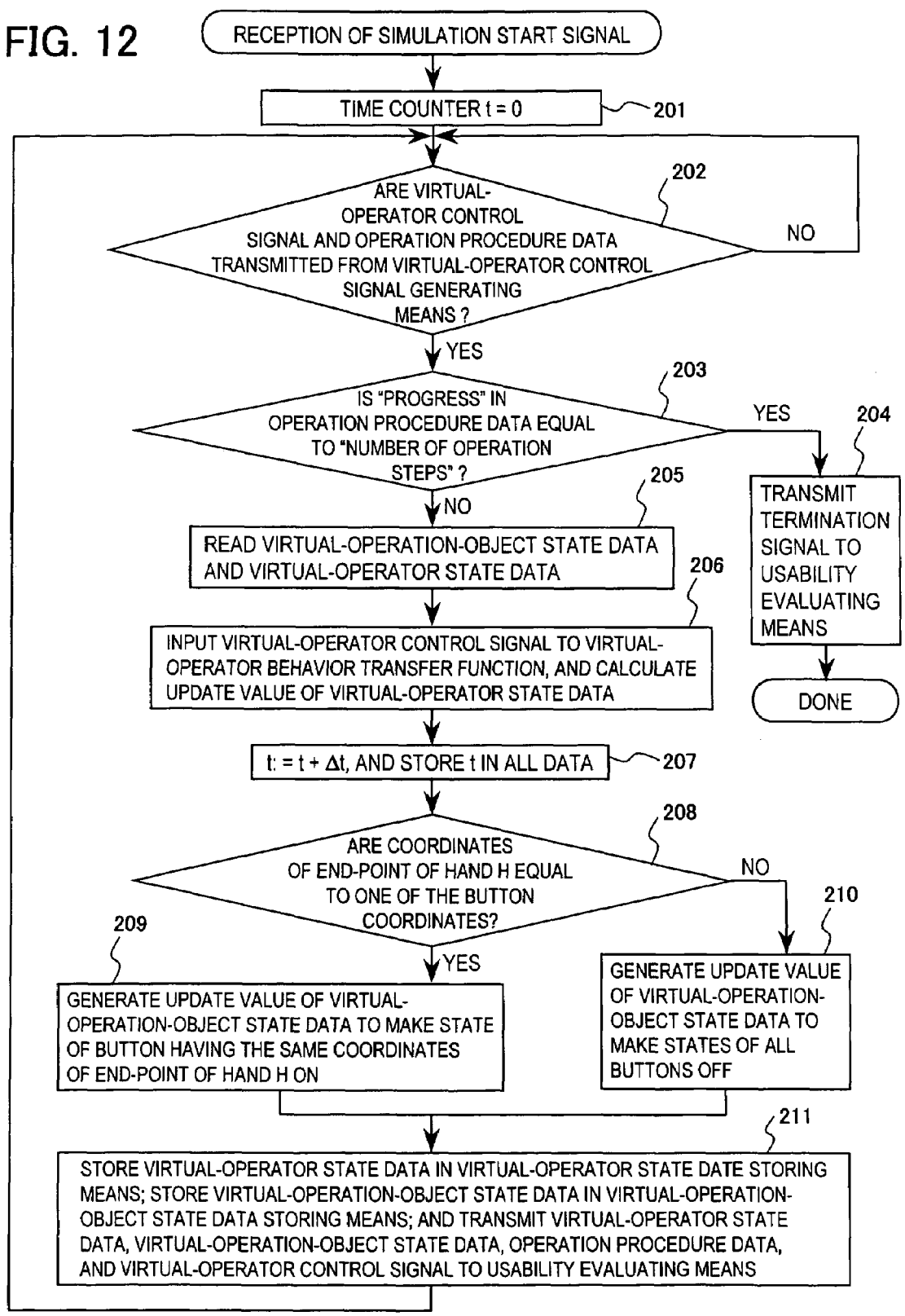
FIG. 12 is a flow chart of simulation processing carried out by a simulation processing means.

FIG. 12 is a flow chart of simulation processing carried out by the simulation processing means 16. The operation of the simulation processing means 16 will be described next. In an initial state, the simulation processing means 16 waits until it receives a simulation start signal from the input means 11. Upon receipt of the simulation start signal, a simulation processing state updating algorithm 16A is launched. The simulation processing state updating algorithm 16A waits until it receives a virtual operator control signal and operation procedure data 14A from virtual-operator control signal generating means 15. As shown in FIG. 12, after the receipt of the simulation start signal, a data variable "time counter t" is first set to "0" (step 201), and then it is determined whether the virtual operator control signal and the operation procedure data 14A are transmitted from the virtual-operator control signal generating means 15. If not, the simulation processing state updating algorithm 16A waits until the virtual operator control signal and the operation procedure data 14A are transmitted (step 202).

Subsequently, it is determined whether all the operation procedures are completed. If completed, a termination signal is transmitted to usability evaluating means 17. At this moment, the termination signal, which is text data, is the operation procedure data 14A whose "progress" entry has the same value as the number of steps. Accordingly, to determine whether or not the operation procedure is completed, entries "progress" and "number of operation steps" in the operation procedure data 14A are compared (step 203). If "progress" is equal to "number of operation steps", that is, the operation procedure is completed, the simulation processing means 16 transmits a termination signal to the usability evaluating means 17 and terminates the process thereof (step 204).

If it is determined that the "progress" is not equal to the "number of operation steps" in the operation procedure data 14A, that is, all of the operation procedures are not completed, data of the simulation state is retrieved and updated as follows: First, the virtual-operation-object state data 12A and the virtual-operator state data 13A are read from the corresponding storing means (step 205). Then, a virtual-operator control signal is input to the virtual-operator behavior transfer function to calculate an update value of the virtual-operator state data 13A (step 206). That is, a variation of the virtual-operator state data 13A caused by the virtual-operator control signal is calculated.

In this embodiment, the variation of the virtual-operator state data 13A is that of a posture of the virtual operator. The controlled variables Cu and Cf are read from the virtual-operator control signal, and the angle Au defined by the X-axis and the upper arm link U and the angle Af defined by the upper arm link U and the lower arm link F are updated as follows:

$$Au := Au + Cu \quad (17)$$

$$Af := Af + Cf \quad (18)$$

Thereafter, the coordinates of the elbow joint E (Ex, Ey) and the coordinates of the end-point of hand H (Hx, Hy) are calculated by the above-described equations (3) to (6).

To calculate a variation of the virtual-operation-object state data 12A caused by a variation of the virtual-operator state data 13A, the time data is updated as "t:=t+Δt", which is written into all the data as a data time (step 207). Then, it is determined whether the coordinates of the end-point of hand H is equal to those of one of the buttons (step 208). The variation of the virtual-operation-object state data 12A is that of a depressing state of the buttons by the virtual operator. This is determined by detecting the coincidence between the coordinates of the end-point of hand H (Hx, Hy) and one of the buttons. Accordingly, the virtual-operation-object state data 12A is updated in accordance with the determination.

That is, the time counter is increased by a predetermined time step width Δt. For example, Δt is set to 0.1, and the time counter is updated using this value. The calculation of the data to be updated is completed by writing the updated time counter t into the "data time" entries of the virtual-operation-object state data 12A and the virtual-operator state data 13A.

If the determination indicates that the coordinates of the end-point of hand H are equal to those of one of the buttons, an update value of the virtual-operation-object state data 12A that makes a state of the button having the same coordinates as the end-point of hand H "ON" is created (step 209). If the coordinates of the end-point of hand H are not equal to those of any one of the buttons, an update value of the virtual-operation-object state data 12A that makes the states of all the buttons "OFF" is created (step 210). Thereafter, the virtual-operator state data 13A is stored in the virtual-operator state data storing means 13, the virtual-operation-object state data 12A is stored in the virtual-operation-object state data storing means 12, and the virtual-operator state data 13A, the virtual-operation-object state data 12A, the operation procedure data 14A, and the virtual-operator control signal are transmitted to the usability evaluating means 17 (step 211). Subsequently, a state at the next data time is calculated. To advance the simulation, the process then returns to step 202, where the process is in a ready state.

That is, after the virtual-operation-object state data 12A is overwritten and stored in the virtual-operation-object state data storing means 12 and the virtual-operator state data 13A is overwritten in the virtual-operator state data storing means 13, all the state data associated with the simulation, namely, the virtual-operation-object state data 12A, the virtual-operator state data 13A, the virtual-operator control signal, and the operation procedure data 14A, are transmitted to the usability evaluating means 17. The simulation processing means 16 then returns to a ready state. The simulation proceeds in such a way.

Figure 13:
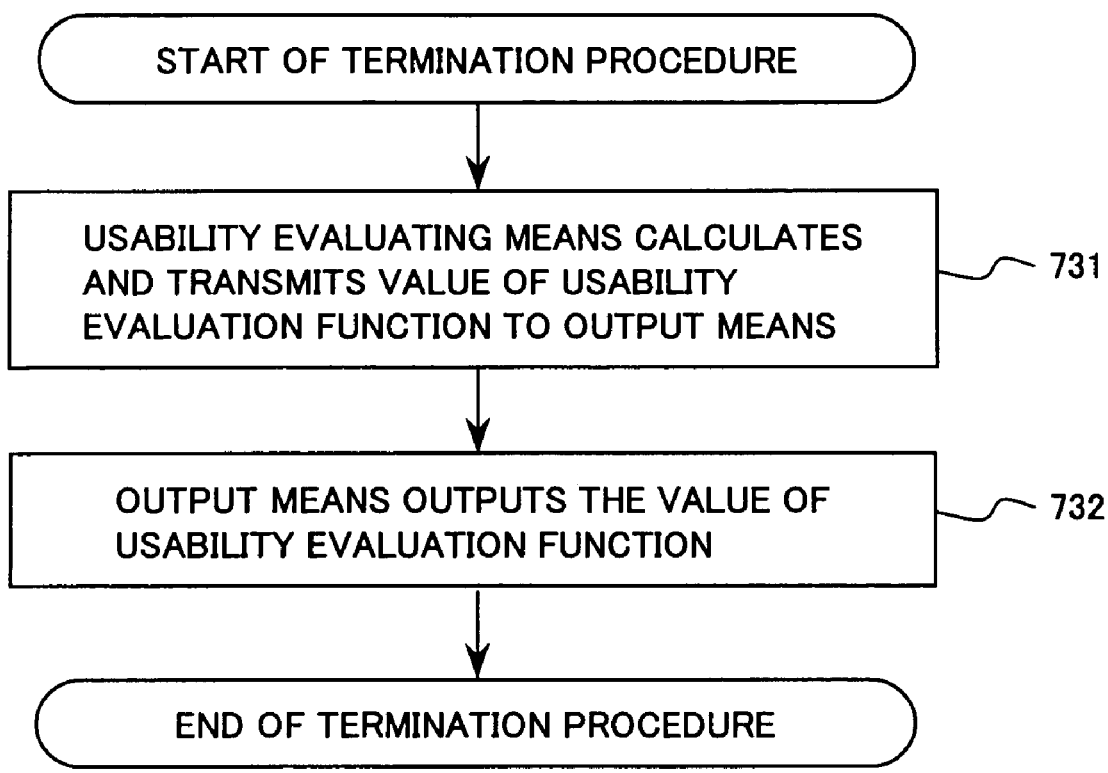
FIG. 13 is a flow chart of a termination procedure.

FIG. 13 is a flow chart of the termination procedure. As shown in FIG. 13, in the termination procedure, the usability evaluating means 17 calculates a value of a usability evaluation function and delivers it to the output means 18 (step 731). After the output means 18 outputs the value of a usability evaluation function (step 732), the termination procedure is completed. Thus, an evaluation of the usability is calculated by the usability evaluating means 17 and the evaluation result is output from the output means 18.

The operation of the usability evaluating means 17 will be described next. In general, the usability of an operation object is evaluated by the length of the required operation time, energy required for the operation, and quality and quantity of errors during operation. Consequently, the usability is evaluated based on data representing these phenomena.

In this embodiment, the usability evaluating means 17 receives all of the state data associated with the simulation from the simulation processing means 16, and calculates an evaluation value based on the state data. Accordingly, the usability is evaluated by defining a usability evaluation function that is appropriate for this case and calculating a value of the function. More specifically, for example, a usability evaluation function, such as the following equation (19), is used to calculate a usability evaluation value U.

$$U = \int |Cu| dt + \int |Cf| dt \quad (19)$$

where the evaluation value U of the usability evaluation function is the integral of the first-order norm of the control variables Cu and Cf for the control time period. The evaluation value U is considered to be a value reflecting kinetic effort that a virtual operator expends on the hand action. That is, in this case, a smaller evaluation value U of usability kinetically facilitates the operating action more, thus being evaluated as more excellent usability.

Finally, the usability evaluating means 17 transmits the calculated evaluation value U of the usability evaluation function to the output means 18, which outputs the calculated result. This is the end of the simulation. The output calculated result can be changed into a variety of display formats depending on an evaluator's request.

INDUSTRIAL APPLICABILITY

As described above, according to the system and method of the present invention for evaluating usability, the usability of an operation object can be evaluated by simulation. Therefore, the system and method for evaluating usability can be effectively used as follows:

By storing simulation data associated with an operator and operational conditions, the data can be used for evaluating usability of other operation objects. Accordingly, the simulation can be effectively performed. Additionally, since properties of the operator and the operational condition can be freely determined, an operation by a special operator and an operational state in a harsh environment can be easily simulated. Also, simulation is not harmful to operators. Since a computer executes the simulation, the simulation can be performed at high speed without human intervention. Moreover, by intentionally increasing an error rate of a virtual operator, operational errors in the simulation can be increased, thus allowing operational difficulties of the operation object to be detected at an early stage. Furthermore, by automatically modeling operation objects and evaluating the performances of the operation objects by comparison, an excellent design plan of a human interface can be automatically created.

What is claimed is:

1. A usability evaluation processing system for evaluating usability by simulation for estimating operating states associated with a human body action with respect to an operation object, comprising:

virtual-operation-object state data storing means for storing virtual-operation-object state data representing a physical state of the operation object;

virtual-operator state data storing means for storing virtual-operator state data representing physical and psychological states of a human;

operation procedure data storing means for storing operation procedure data representing an operation procedure sequence;

virtual-operator control signal generating means for generating a virtual-operator control signal controlling the virtual-operator state data based on the operation procedure data, the virtual-operation-object state data, and the virtual-operator state data;

simulation processing means for updating the virtual-operation-object state data and the virtual-operator state data to states at the next time step based on the virtual-operation-object state data, the virtual-operator state data, and the virtual-operator control signal;

input means for receiving a simulation start command, the input means inputting data to the virtual-operation-object state data storing means, the virtual-operator state data storing means, and the operation procedure data storing means, the input means inputting a simulation start signal to the simulation processing means;

usability evaluating means for calculating a value of a usability evaluation function in accordance with the virtual-operation-object state data and the virtual-operator state data updated by the simulation processing means, or a history of the updated data; and output means for outputting resultant data of the simulation and the usability evaluation value.

2. A usability evaluating method for allowing a computer to execute a usability evaluating process by simulation for estimating operating states associated with a human body action with respect to an operation object, the method comprising:

a step of storing virtual-operation-object state data representing a physical state of the operation object;

a step of storing virtual-operator state data representing physical and psychological states of a human;

a step of storing operation procedure data representing an operation procedure sequence;

a step of generating a virtual-operator control signal controlling the virtual-operator state data based on the operation procedure data, the virtual-operation-object state data, and the virtual-operator state data;

a simulation processing step of updating the virtual-operation-object state data and the virtual-operator state data to states at the next time step based on the virtual-operation-object state data, the virtual-operator state data, and the virtual-operator control signal;

an input step of receiving a simulation start command, inputting the virtual-operation-object state data, the virtual-operator state data, and the operation procedure data, and inputting a simulation start signal for starting the simulation processing step;

a step of calculating a value of a usability evaluation function in accordance with the virtual-operation-object state data and the virtual-operator state data updated in the simulation processing step, or a history of the updated data; and an output step for outputting resultant data of the simulation and the usability evaluation value.

* * * * *